(12) United States Patent
Hanada et al.

(10) Patent No.: US 12,213,351 B2
(45) Date of Patent: Jan. 28, 2025

(54) SEMICONDUCTOR DEVICE AND DISPLAY DEVICE

(71) Applicant: Japan Display Inc., Tokyo (JP)

(72) Inventors: Akihiro Hanada, Tokyo (JP); Toshinari Sasaki, Tokyo (JP); Ryo Onodera, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 485 days.

(21) Appl. No.: 17/570,396

(22) Filed: Jan. 7, 2022

(65) Prior Publication Data

US 2022/0216281 A1    Jul. 7, 2022

(30) Foreign Application Priority Data

Jan. 7, 2021 (JP) ................. 2021-001469

(51) Int. Cl.
*H10K 59/124* (2023.01)
*H10K 59/121* (2023.01)

(52) U.S. Cl.
CPC ....... *H10K 59/124* (2023.02); *H10K 59/1213* (2023.02)

(58) Field of Classification Search
CPC .............. H10K 59/124; H10K 59/1213; H01L 29/78633; H01L 29/66969; H01L 29/7869; H01L 2029/7863; H01L 27/1225
See application file for complete search history.

(56) References Cited

U.S. PATENT DOCUMENTS

| | | | |
|---|---|---|---|
| 2009/0179276 A1* | 7/2009 | Voldman | H01L 21/823892 257/369 |
| 2013/0299819 A1 | 11/2013 | Yamazaki et al. | |
| 2018/0033849 A1* | 2/2018 | Noh | H01L 27/124 |
| 2018/0069132 A1* | 3/2018 | Lim | H01L 27/1225 |
| 2020/0259020 A1 | 8/2020 | Watakabe et al. | |

FOREIGN PATENT DOCUMENTS

| | | |
|---|---|---|
| JP | 2013-254950 A | 12/2013 |
| JP | 2020-129635 A | 8/2020 |

* cited by examiner

*Primary Examiner* — Sitaramarao S Yechuri
(74) *Attorney, Agent, or Firm* — XSENSUS LLP

(57) ABSTRACT

According to one embodiment, in a first concentration of an impurity element contained in a first impurity region, a second concentration of the impurity element contained in a second impurity region, a third concentration of the impurity element contained in a third impurity region, and a fourth concentration of the impurity element contained in a high-concentration impurity region, the third concentration is equal to the fourth concentration, the third concentration is higher than the first concentration, and the first concentration is higher than the second concentration.

11 Claims, 11 Drawing Sheets

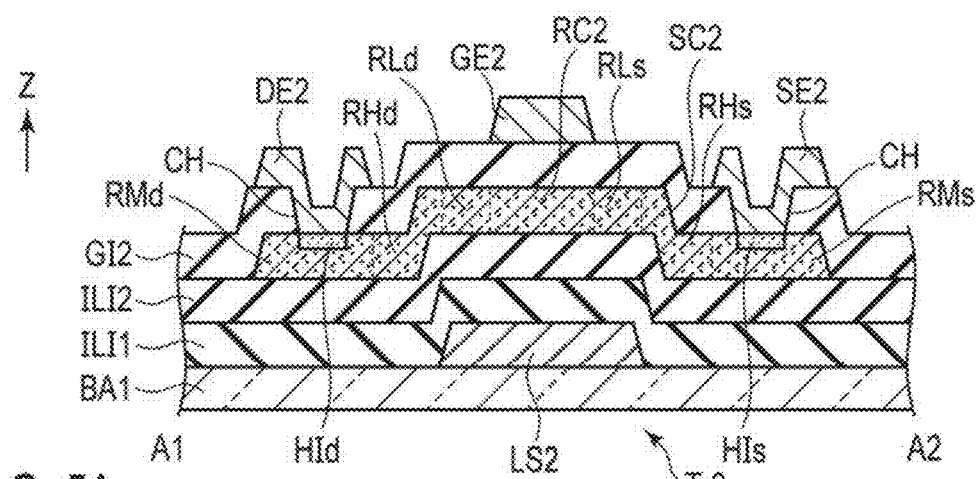
FIG. 5A
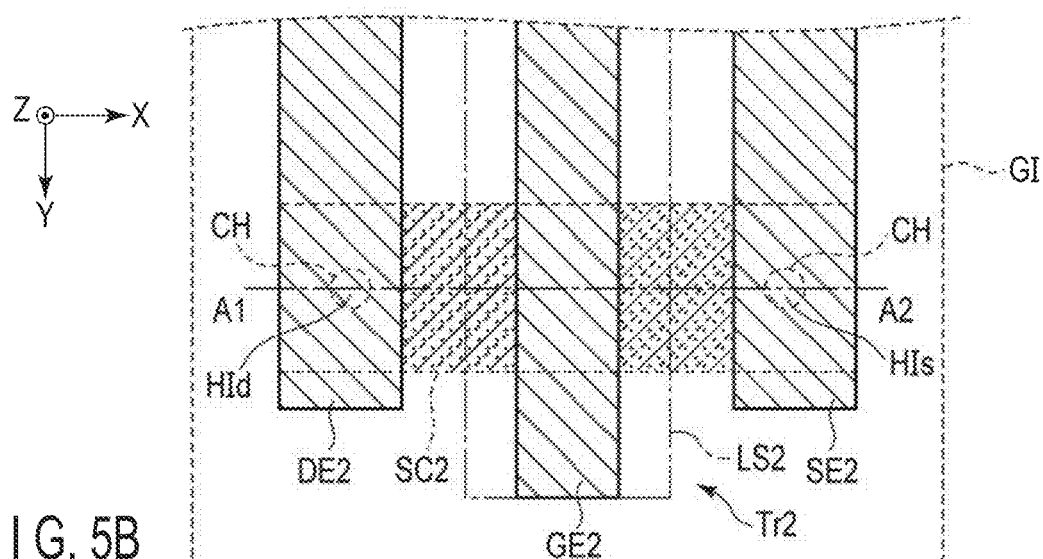
FIG. 5B
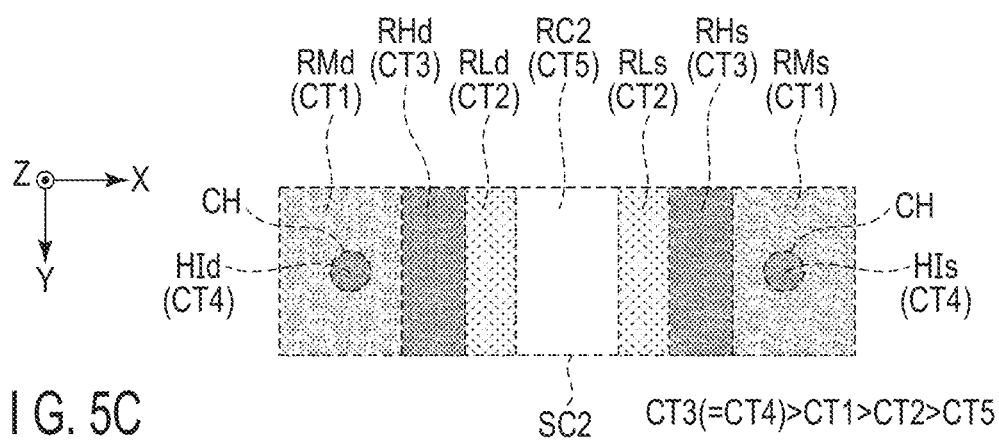
FIG. 5C  CT3(=CT4)>CT1>CT2>CT5

SEMICONDUCTOR DEVICE AND DISPLAY DEVICE

CROSS-REFERENCE TO RELATED APPLICATIONS

This application is based upon and claims the benefit of priority from Japanese Patent Application No. 2021-001469, filed Jan. 7, 2021, the entire contents of which are incorporated herein by reference.

FIELD

Embodiments described herein relate generally to a semiconductor device and a display device.

BACKGROUND

In a display device, a technique has been proposed in which a transistor having an oxide semiconductor is provided in a pixel circuit in a display area, and a transistor having a silicon semiconductor is provided in a drive circuit in a peripheral area.

BRIEF DESCRIPTION OF THE DRAWINGS

FIG. 5A is a diagram illustrating a transistor.
FIG. 5B is a diagram illustrating a transistor.
FIG. 5C is a diagram illustrating a transistor.

DETAILED DESCRIPTION

Figure 1:
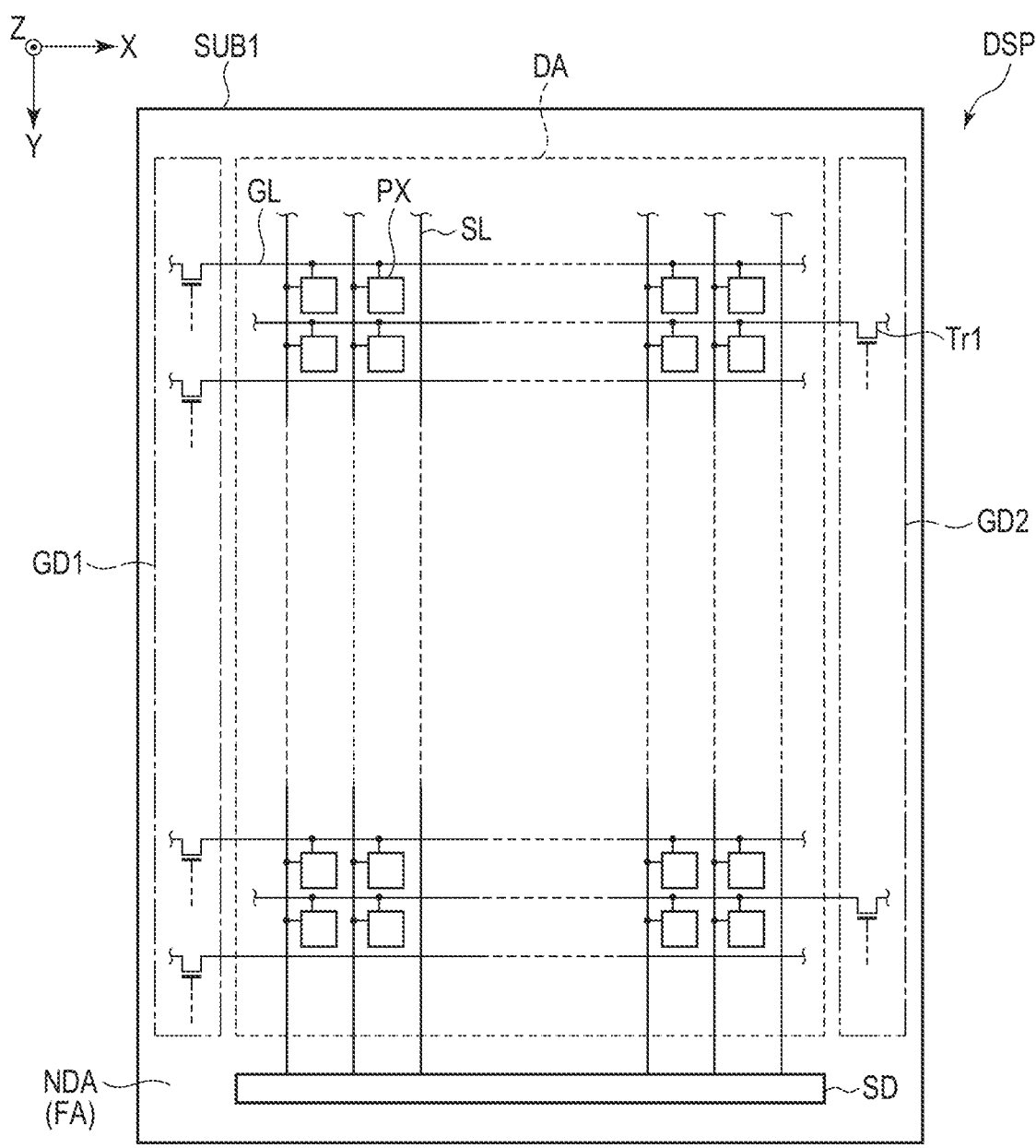
FIG. 1 is a plan view showing the configuration of a display device including a semiconductor device according to the present embodiment.

In general, according to one embodiment, a semiconductor device comprising: an oxide semiconductor layer; an insulating layer in contact with the oxide semiconductor layer; and a gate electrode, a source electrode, and a drain electrode, the gate electrode, the source electrode, and the drain electrode overlapping the oxide semiconductor layer, wherein the oxide semiconductor layer includes a channel forming region overlapping the gate electrode, a high-concentration impurity region in contact with the source electrode and the drain electrode, a first impurity region overlapping the source electrode and the drain electrode, the first impurity region being different from the high-concentration impurity region, a second impurity region provided between the channel forming region and the first impurity region, and a third impurity region provided between the first impurity region and the second impurity region, the high-concentration impurity region, the first impurity region, the second impurity region, and the third impurity region contain an equal impurity element, and in a first concentration of the impurity element contained in the first impurity region, a second concentration of the impurity element contained in the second impurity region, a third concentration of the impurity element contained in the third impurity region, and a fourth concentration of the impurity element contained in the high-concentration impurity region, the third concentration is equal to the fourth concentration, the third concentration is higher than the first concentration, and the first concentration is higher than the second concentration.

According to another embodiment, a semiconductor device comprising: an oxide semiconductor layer; an insulating layer in contact with the oxide semiconductor layer; and a gate electrode, a source electrode, and a drain electrode, the gate electrode, the source electrode, and the drain electrode overlapping the oxide semiconductor layer, wherein the oxide semiconductor layer includes a channel forming region overlapping the gate electrode, a high-concentration impurity region, at least a part of the high-concentration impurity region being in contact with and overlapping the source electrode and the drain electrode, a first region overlapping the source electrode and the drain electrode, the first region being different from the high-concentration impurity region, and a second impurity region provided between the channel forming region and the first region, the source electrode and the drain electrode have a stacked structure of a first metal layer and a second metal layer, the high-concentration impurity region and the second impurity region contain an equal impurity element, and a first concentration of the impurity element contained in the high-concentration impurity region is lower than or equivalent to a second concentration of the impurity element contained in the second impurity region.

According to the present embodiment, it is possible to provide a semiconductor device and a display device having improved reliability.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

An embodiment will now de described in detail with reference to accompanying drawings.

In the following descriptions, for example, a first direction X, a second direction Y and a third direction Z are orthogonal to each other, but may intersect at an angle other than ninety degrees. A direction forwarding a tip of an arrow indicating the third direction Z is referred to as "upward" and a direction forwarding oppositely from the tip of the arrow is referred to as "downward".

With such expressions "a second member above a first member" and "a second member below a first member", the second member may be in contact with the first member or may be remote from the first member. In the latter case, a third member may be interposed between the first member and the second member. On the other hand, with such expressions "a second member on a first member" and "a second member on a first member", the second member is meant to be in contact with the first member.

In addition, it is assumed that there is an observation position to observe the semiconductor substrate on a tip side of an arrow in a third direction Z, and viewing from this observation position toward the X-Y plane defined by the first direction X and the second direction Y is referred to as a planar view. Viewing a cross section of the semiconductor substrate in an X-Z plane defined by the first direction X and the third direction Z or a Y-Z plane defined by the second direction Y and the third direction Z is referred to as a cross-sectional view.

[Embodiment]

FIG. 1 is a plan view showing the configuration of a display device including a semiconductor device according to the present embodiment. A display device DSP includes a display area DA in which an image is displayed and a peripheral area (non-display area) NDA around the display area DA. In the example illustrated in FIG. 1, the peripheral area NDA is formed in a frame shape surrounding the display area DA. The peripheral area NDA is also referred to as a frame area FA.

The display device DSP includes gate drivers GD1 and GD2 and a source driver SD in the peripheral area NDA. The gate drivers GD1 and GD2 include a transistor Tr1. As described above, the gate drivers GD1 and GD2 are formed on the same substrate together with the components in the display area DA.

The display device DSP includes a plurality of pixels PX, a plurality of scanning lines GL, and a plurality of signal lines SL in the display area DA. The plurality of pixels PX is arranged in a matrix in the first direction X and the second direction Y.

The plurality of scanning lines GL extends along the first direction X and is arranged in the second direction Y spaced apart from each other. The scanning line GL is sometimes referred to as a gate line. The scanning line GL is electrically connected to the gate drivers GD1 and GD2. For example, the odd-numbered scanning line GL is connected to the gate driver GD1 and the even-numbered scanning line GL is connected to the gate driver GD2. The scanning lines GL are driven by the gate drivers GD1 and GD2.

The plurality of signal lines SL extends along the second direction Y and is arranged in the first direction X spaced apart from each other. The signal line SL is sometimes referred to as a source line. In the display area DA, the plurality of signal lines SL intersects with the plurality of scanning lines GL. The signal line SL is electrically connected to the source driver SD. The signal lines SL are driven by the source driver SD.

The pixels PX each include a transistor Tr2 and a pixel electrode PE, which will be described later. Although the details will be described later, the transistor Tr1 and the transistor Tr2 are formed of, for example, a thin-film transistor (TFT). The transistor Tr2 is electrically connected to the scanning line GL and the signal line SL. The scanning line GL is electrically connected to the transistor Tr2 in each of the pixels PX arranged in the first direction X. The signal line SL is electrically connected to the transistor Tr2 in each of the pixels PX arranged in the second direction Y.

In the present embodiment, the transistors Tr1 and Tr2 are sometimes referred to as a semiconductor device. A substrate including the transistors Tr1 and Tr2, various wiring lines, and various electrodes is sometimes referred to as a semiconductor device.

Figure 2:
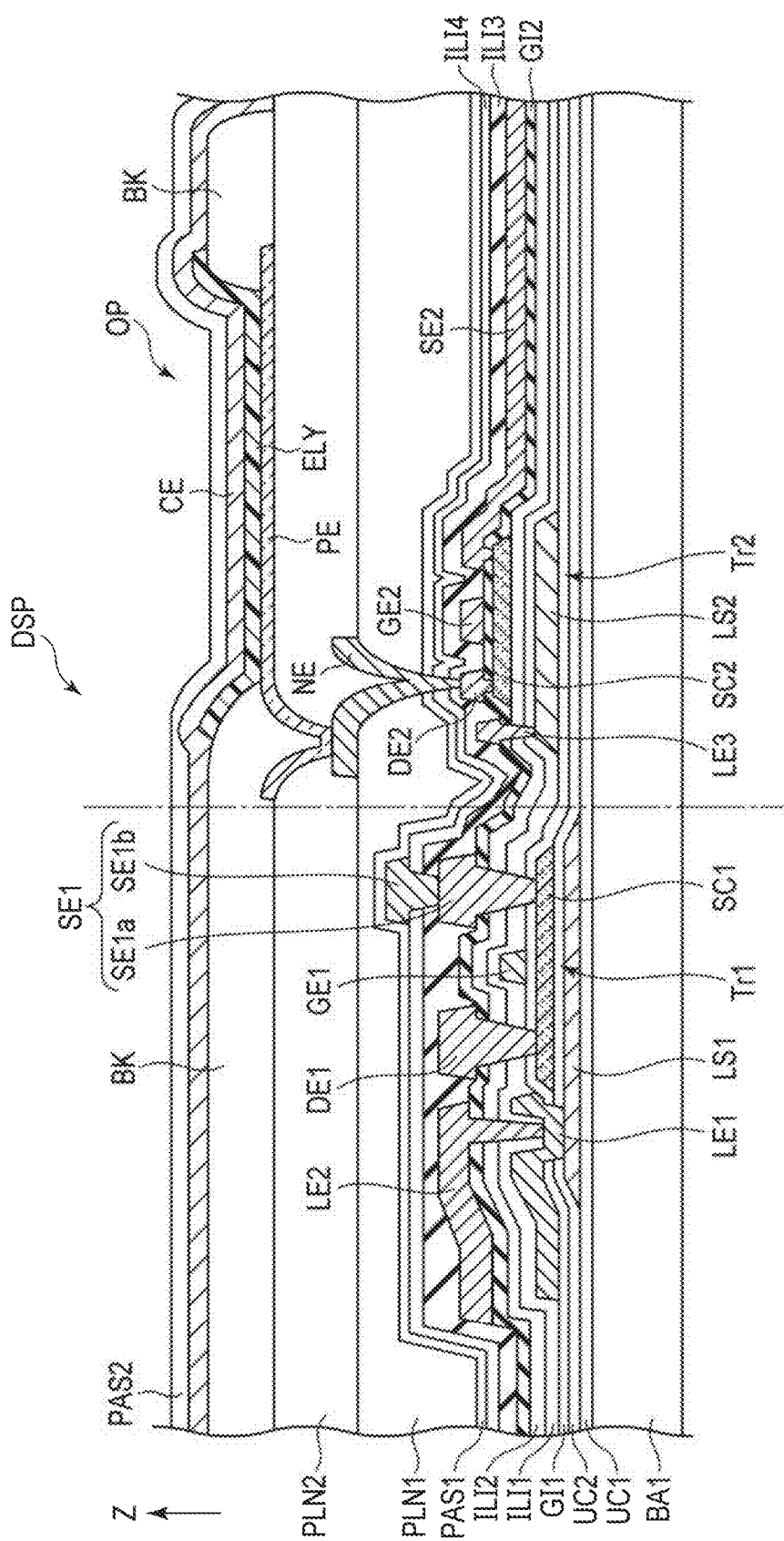
FIG. 2 is a conceptual cross-sectional view of the display device of the embodiment.

FIG. 2 is a conceptual cross-sectional view of the display device of the embodiment. Hatching of a part of components is omitted to make the drawings easier to read. The display device DSP shown in FIG. 2 includes a base material BA1, an insulating layer UC1, a light-shielding layer LS1, an insulating layer UC2, the transistor Tr1, an insulating layer ILI1, an insulating layer ILI2, a light-shielding layer LS2, the transistor Tr2, an insulating layer ILI3, an insulating layer ILI4, an insulating layer PAS1, an insulating layer PLN1, a connection electrode NE, an insulating layer PLN2, the pixel electrode PE, an organic EL layer ELY, a common electrode CE, and an insulating layer PAS2.

The material of the base material BA1 is glass or resin. Examples of such a resin include a polyimide resin and an acrylic resin.

The insulating layer UC1 blocks impurities derived from glass and the like, and is formed of, for example, a single layer or a stack of silicon oxide or silicon nitride.

The light-shielding layer LS1 has a function that shields the semiconductor layer of the transistor Tr1 from light. In the case in which the light-shielding layer LS1 is a metal layer, the light-shielding layer LS1 may have a function as the back gate of the transistor Tr1. In that case, it can be said that the light-shielding layer LS1 is included in the transistor Tr1.

On the light-shielding layer LS1 and the insulating layer UC1, the insulating layer UC2 is provided. The insulating layer UC2 only has to be made of the same material as the insulating layer UC1.

On the insulating layer UC2, a semiconductor layer SC1 that is the active layer of the transistor Tr1 is provided. The semiconductor layer SC1 is made of polycrystalline silicon.

The semiconductor layer SC1 is sometimes referred to as a first semiconductor layer or a polycrystalline silicon layer.

The semiconductor layer SC1 has a channel forming region overlapping a gate electrode GE1, a source region overlapping a source electrode SE1, and a drain region overlapping a drain electrode DE1.

On the semiconductor layer SC1 and the insulating layer UC2, an insulating layer GI1 is provided. The insulating layer GI1 is made of, for example, silicon oxide. The insulating layer GI1 is the gate insulating layer of the transistor Tr1.

On the insulating layer GI1, the gate electrode GE1 of the transistor Tr1, an electrode LE1, and the light-shielding layer LS2 are provided. In other words, the insulating layer GI1 is provided between the semiconductor layer SC1 and the gate electrode GE1. The gate electrode GE1, the electrode LE1, and the light-shielding layer LS2 are formed of, for example, a molybdenum-tungsten (MoW) alloy or a stack of an aluminum alloy sandwiched between titanium.

The electrode LE1 is connected to the light-shielding layer LS1 through contact holes provided in the insulating layers UC2 and GI1. As described above, in the case in which the light-shielding layer LS1 functions as the back gate of the transistor Tr1, a signal is input through the electrode LE1.

The light-shielding layer LS2 shields the active layer of the transistor Tr2 from light. The light-shielding layer LS2 may function as the back gate of the transistor Tr2. In that case, it can be said that the light-shielding layer LS2 is included in the transistor Tr2.

On the insulating layer GI1, the insulating layer ILI1 is provided covering the gate electrode GE1, the electrode LE1, and the light-shielding layer LS2. The insulating layer ILI1 is made of, for example, silicon nitride.

On the insulating layer ILI1, the insulating layer ILI2 is provided. The insulating layer ILI2 is made of, for example, silicon oxide. The insulating layers ILI1 and ILI2 function as the interlayer insulating layer of the transistor Tr1. The insulating layers ILI1 and ILI2 also function as an insulating layer between the light-shielding layer LS2 and a semiconductor layer SC2.

On the insulating layer ILI2, the semiconductor layer SC2 is provided overlapping the light-shielding layer LS2. The semiconductor layer SC2 is made of an oxide semiconductor. The semiconductor layer SC2 is sometimes referred to as a second semiconductor layer or an oxide semiconductor layer. Oxide semiconductors include Indium Gallium Zinc Oxide (IGZO), Indium Tin Zinc Oxide (ITZO), Zinc Oxide Nitride (ZnON), Indium Gallium Oxide (IGO), and the like.

The semiconductor layer SC2 has a channel forming region overlapping a gate electrode GE2, a source region overlapping a source electrode SE2, and a drain region overlapping a drain electrode DE2. The gate electrode GE2 is electrically connected to the scanning line GL. The gate electrode GE2 may be integrally formed with the scanning line GL.

On the semiconductor layer SC2 and the insulating layer ILI2, an insulating layer GI2 is provided in contact with the semiconductor layer SC2. The insulating layer GI2 is formed of, for example, silicon oxide or silicon oxide containing nitrogen. The insulating layer GI2 functions as the gate insulating layer of the transistor Tr2. It can be said that the semiconductor layer SC2 is provided between the insulating layers ILI2 and GI2.

On the insulating layer GI2, there are provided the gate electrode GE2 overlapping the channel forming region of the semiconductor layer SC2, the source electrode SE2 overlapping the source region of the semiconductor layer SC2, the drain electrode DE2 overlapping the drain region of the semiconductor layer SC2, a source electrode SE1a overlapping the source region of the layer SC1, the drain electrode DE1 overlapping the drain region of the semiconductor layer SC1, an electrode LE2 connected to the electrode LE1, and an electrode LE3 connected to the light-shielding layer LS2. In other words, the insulating layer GI2 is provided between the semiconductor layer SC2 and the gate electrode GE2. The gate electrode GE2, the source electrode SE2, the drain electrode DE2, the source electrode SE1a, the drain electrode DE1, the electrode LE2, and the electrode LE3 are formed of, for example, a titanium layer, a stacked film having an aluminum alloy layer sandwiched between titanium films, a molybdenum layer, or an alloy layer of molybdenum and tungsten. As described later, these electrodes may be a stacked film of a titanium nitride layer and a titanium layer.

The insulating layer ILI3 is provided covering the insulating layer GI2, the gate electrode GE2, the source electrode SE2, the drain electrode DE2, the source electrode SE1a, the drain electrode DE1, the electrode LE2, and the electrode LE3. The insulating layer ILI4 is provided on the insulating layer ILI3. The insulating layers ILI3 and ILI4 are formed of silicon nitride and silicon oxide, respectively.

On the insulating layer ILI4, a source electrode SE1b connected to the source electrode SE1a is provided. The source electrode SE1b is formed of a metal material, for example, a stacked film having an aluminum alloy layer sandwiched between titanium films.

The source electrodes SE1a and SE1b are combined to form the source electrode SE1. The source electrode SE1b may be integrally formed with the signal line SL. The source electrode SE1 (the source electrodes SE1a and SE1b) may be integrally formed with the signal line SL.

The insulating layer PAS1 is provided covering the insulating layer ILI4 and the source electrode SE1b. The insulating layer PAS1 is made of, for example, silicon oxide.

The insulating layer PLN1 is provided covering the insulating layer PAS1. The insulating layer PLN1 is made of an organic insulating material, for example, polyimide.

On the insulating layer PLN1, the connection electrode NE connected to the drain electrode DE2 is provided. The connection electrode NE is formed of, for example, a stacked film having an aluminum alloy layer sandwiched between titanium films. In the present embodiment, although the configuration in which the connection electrode NE is provided is described, the present invention is not limited to this. A configuration may be provided in which the connection electrode NE is not provided, and the pixel electrode PE, described later, is directly connected to the drain electrode DE2.

The insulating layer PLN2 is provided covering the insulating layer PLN1 and the connection electrode NE. The insulating layer PLN2 is made of an organic insulating material, for example, polyimide. The insulating layers PLN1 and PLN2 have a function that planarizes the unevenness of a substrate SUB1 caused by a transistor or the like.

On the insulating layer PLN2, the pixel electrode PE connected to the connection electrode NE is provided. The pixel electrode PE may be connected to the drain electrode DE2.

The pixel electrode PE may have a stacked structure of a first conductive layer having reflectivity and a second conductive layer having translucency. For example, a configuration may be provided in which silver (Ag) is used as the material of the first conductive layer, indium zinc oxide (IZO) is used as the material of the second conductive layer, and the pixel electrode PE is formed of a stacked structure in which IZO, Ag, and IZO are stacked in this order.

Between the adjacent pixel electrodes PE, a bank BK (also referred to as a convex portion, a rib, or a barrier wall) is provided. As the material of the bank BK, the same organic material as the material of the insulating layers PLN1 and PLN2 is used. The bank BK is opened so as to expose a part of the pixel electrode PE. In addition, the end portion of an opening portion OP preferably has a gentle taper shape. When the end portion of the opening portion OP has a steep shape, poor coverage occurs in the organic EL layer ELY, which is formed later.

The organic EL layer ELY is provided between the adjacent bank BK, overlapping the pixel electrode PE. The organic EL layer ELY includes a hole-injection layer, a hole-transport layer, an electron-blocking layer, a light-emitting layer, a hole-blocking layer, an electron-transport layer, an electron-injection layer, and the like. In the present specification, the organic EL layer ELY is also referred to as an organic material layer. The organic EL layer ELY includes at least a light-emitting layer, and other layers may be appropriately provided as needed.

The common electrode CE is provided covering the organic EL layer ELY and the bank BK. The common electrode CE may include, for example, a first layer and a second layer. The second layer may have a higher transmittance than that of the first layer. For example, a thin film of a magnesium-silver (MgAg) alloy or an ytterbium-silver (YbAg) alloy may be formed as the first layer. As the second layer, a transparent electrode, for example, indium tin oxide (ITO) or indium zinc oxide (IZO) is formed.

In the present embodiment, the pixel electrode PE serves as an anode (a positive electrode) and the common electrode CE serves as a cathode (a negative electrode). The light emitted from the organic EL layer ELY is taken out upward. That is, the display device DSP has a top emission structure.

The insulating layer PAS2 is provided covering the common electrode CE. The insulating layer PAS2 has a function that prevents moisture from entering the organic EL layer ELY from the outside and has an optical adjustment function. As the insulating layer PAS2, one having a high gas barrier property is suitable. The insulating layer PAS2 may be, for example, a stack of an organic insulating layer and an inorganic insulating layer containing nitrogen. Alternatively, an example of the insulating layer PAS2 includes an insulating layer in which an organic insulating layer is sandwiched between two inorganic insulating layers containing nitrogen. The insulating layer PAS2 may have a structure in which two inorganic insulating layers are stacked. Examples of the material of the organic insulating layer include acrylic resins, epoxy resin, and polyimide resins. Examples of the material of the inorganic insulating layer containing nitrogen include silicon nitride and aluminum nitride.

Although not illustrated in the drawing, an organic resin layer or a base material BA2 facing the base material BA1 may be further provided on the insulating layer PAS2.

In the present embodiment, although the organic EL display device having the organic EL layer ELY is described, the present invention is not limited to this. The present embodiment is applicable to a display device having a liquid crystal layer. The display device DSP of the present embodiment only has to have an organic EL layer or a liquid crystal layer as a display function layer.

Figure 3:
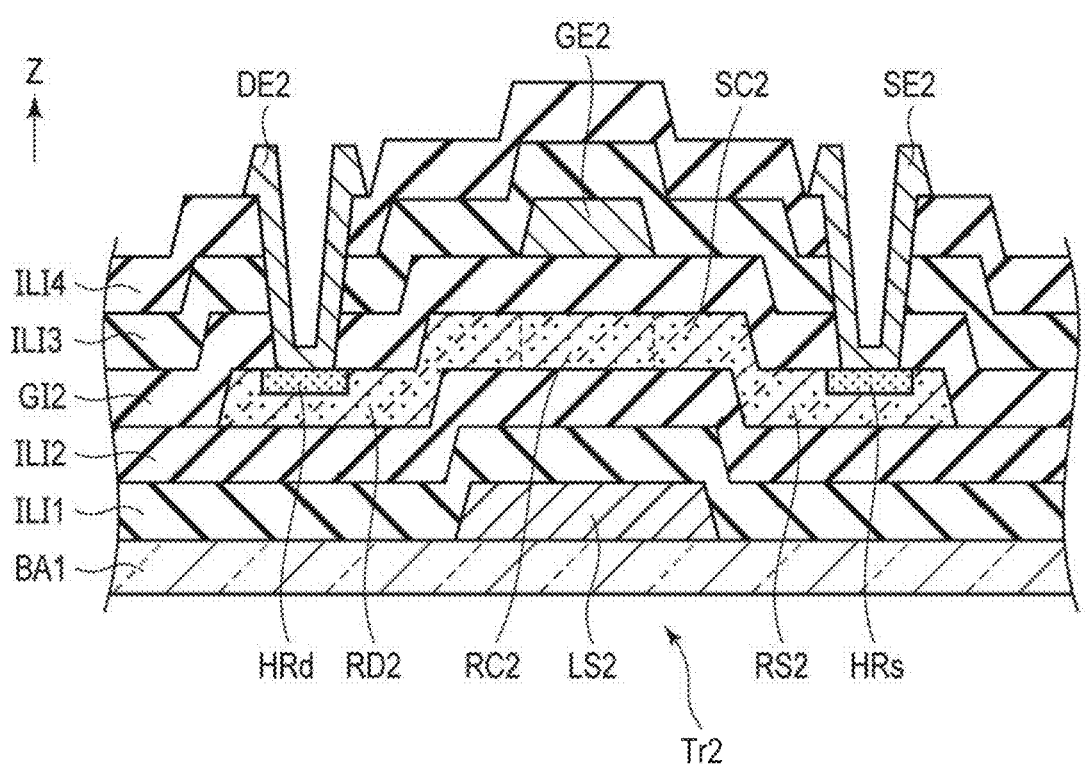
FIG. 3 is a cross-sectional view of a transistor of a comparative example.

FIG. 3 is a cross-sectional view of a transistor of a comparative example. Although a transistor Tr2 shown in FIG. 3 is formed on a base material BA1, the transistor Tr2 may be provided on the insulating layer similarly to FIG. 2.

In a semiconductor layer SC2 of the transistor Tr2, a channel forming region RC2, a source region RS2, and a drain region RD2 are formed. In the semiconductor layer SC2 that is an oxide semiconductor layer, regions in direct contact with a source electrode SE2 and a drain electrode DE2 are referred to as regions HRs and HRd, respectively. As described above, the source electrode SE2 and the drain electrode DE2 are made of a metal material. In the case in which it is unnecessary to distinguish between the regions HRs and HRd, both are referred to as a region HR.

When the oxide semiconductor layer and the metal wiring line come into contact with each other, the metal wiring line extracts oxygen from the oxide semiconductor layer to reduce the oxide semiconductor layer and oxidize itself. As a result, the resistance values of the regions HRs and HRd are decreased, and thus the regions HRs and HRd are electrically connected to the source electrode SE2 and the drain electrode DE2, respectively. However, the oxygen extraction from the oxide semiconductor layer by this metal wiring line contact alone does not sufficiently reduce the resistance of the regions HRs and HRd, and the contact resistance is prone to increase. Therefore, the reliability of the transistor Tr2 might be degraded.

In the present embodiment, ions are injected penetrating the source electrode SE2 and the drain electrode DE2, and thus the resistance of the semiconductor layer SC2 is decreased. As a result, it possible to improve the reliability of the transistor Tr2.

Figure 4A:
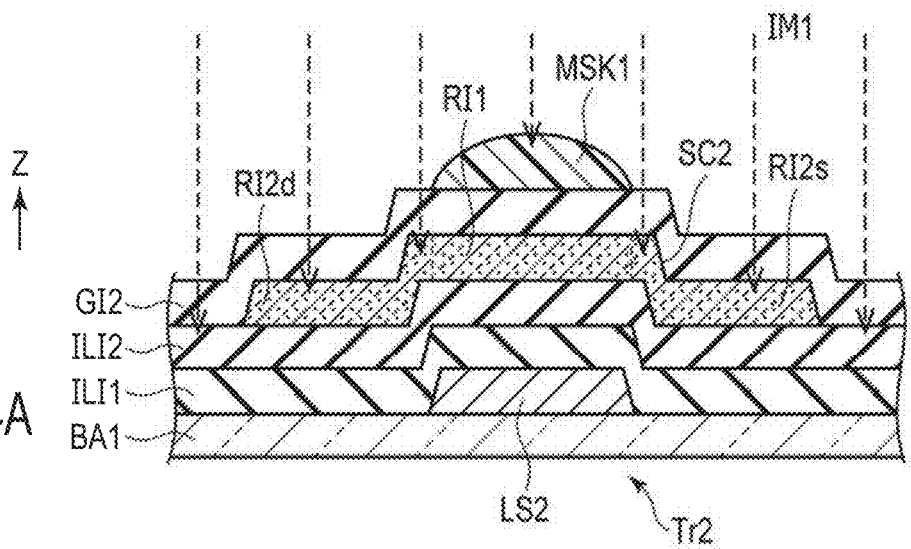
FIG. 4A is a cross-sectional view showing a manufacturing process of a transistor.
Figure 4B:
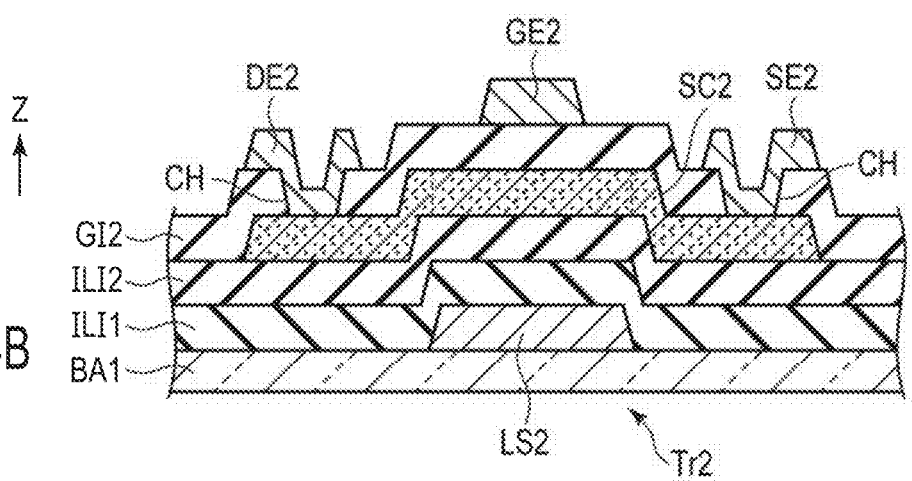
FIG. 4B is a cross-sectional view showing a manufacturing process of a transistor.
Figure 4C:
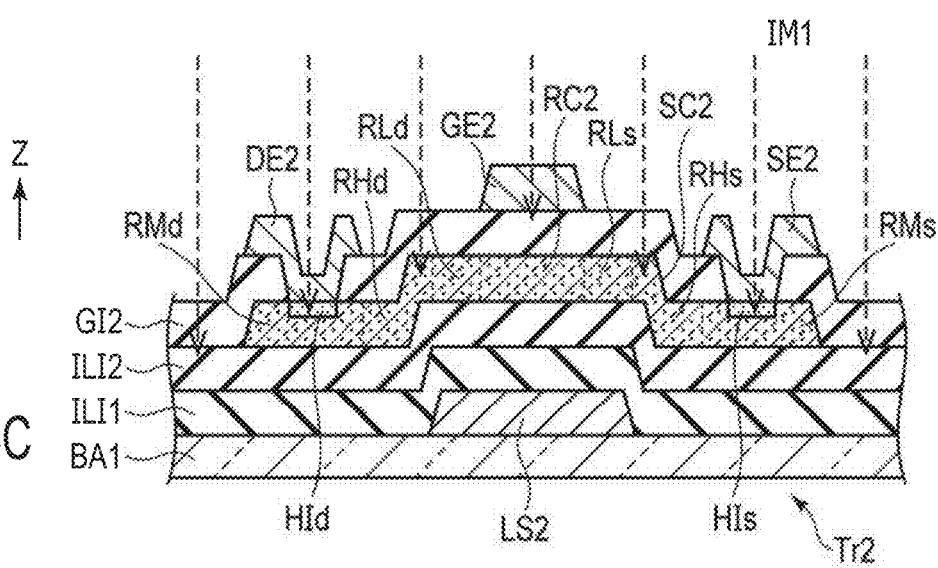
FIG. 4C is a cross-sectional view showing a manufacturing process of a transistor.

FIGS. 4A to 4C are cross-sectional views showing a manufacturing process of the transistor Tr2. The light-shielding layer LS2 is formed on the base material BA1. Although not shown in FIG. 4A, an insulating layer may be provided between the base material BA1 and the light-shielding layer LS2 similarly to FIG. 2.

The insulating layers ILI1 and ILI2 are formed covering the light-shielding layer LS2. On the insulating layer ILI2, an oxide semiconductor film is formed on and shaped into an island-like shape to form a semiconductor layer SC2 that overlaps the light-shielding layer LS2.

The insulating layer GI2 is formed covering the semiconductor layer SC2.

On the insulating layer GI2, a mask MSK1 is formed overlapping a part of the semiconductor layer SC2.

Using the mask MSK1, an impurity element IM1 is injected into the semiconductor layer SC2, penetrating the insulating layer GI2 (this is a first injection process) (see FIG. 4A). The impurity element IM1 is, for example, boron (B). In the semiconductor layer SC2, no impurity element IM1 is injected into a region overlapping the mask MSK1 (referred to as a region RI1), since the mask MSK1 and the insulating layer GI2 serve as a mask.

The region of the semiconductor layer SC2 into which the impurity element IM1 is injected is referred to as a region RI2. In the region RI2, a region close to the source electrode SE2, which will be described later, is referred to as RI2*s*, and a region close to the drain electrode DE2 is referred to as RI2*d*. The impurity concentration of the impurity element IM1 in the region RI2 (RI2*s* and RI2*d*) is referred to as an impurity concentration CT1. In the first injection process, the resistance of region RI2 is decreased.

The region RI1 is disposed between the regions RI2*s* and RI2*d*.

The mask MSK1 is removed, and a contact hole CH reaching the semiconductor layer SC2 is formed on the insulating layer GI2.

With the insulating layer GI2 and the contact hole CH covered, a metal film is formed. For the metal film, a titanium film, for example, is used. The metal film is shaped, and on the insulating layer GI2, the gate electrode GE2 overlapping on a part of the region RI1 of the semiconductor layer SC2, the source electrode SE2 overlapping a part of the region RI2s of the semiconductor layer SC2, the drain electrode DE2 overlapping a part of the region RI2d of the semiconductor layer SC2 are formed (see FIG. 4B).

The source electrode SE2 is in contact with the region RI2s through the contact hole CH. The drain electrode DE2 is in contact with the region RI2d through the contact hole CH.

The film thicknesses of the source electrode SE2 and the drain electrode DE2 may be a thickness in which in an injection process, performed later, the impurity element IM1 can be injected into the high-concentration impurity region of the semiconductor layer SC2, penetrating the source electrode SE2 and the drain electrode DE2. The film thickness is, for example, 50 nm or more and 200 nm or less, preferably 150 nm.

After forming the gate electrode GE2, the source electrode SE2, and the drain electrode DE2, the impurity element IM1 is injected (a second injection process) (see FIG. 4C).

In the second injection process, in the regions overlapping the gate electrode GE2, the source electrode SE2, and the drain electrode DE2, the impurity element IM1 does not reach the depth of the semiconductor layer SC2 due to the film thickness of these electrodes and the insulating layer GI2. In other words, no impurity element IM1 is injected into the semiconductor layer SC2.

In the region of the semiconductor layer SC2 that does not overlap the gate electrode GE2, the source electrode SE2, and the drain electrode DE2, the resistance is decreased by the second injection process.

In the region RI1 that overlaps the gate electrode GE2, the channel forming region RC2 is formed. As described above, since the gate electrode GE2 overlaps the channel forming region RC2, the gate electrode GE2 and the insulating layer GI2 function as masks, and no impurity element IM1 is injected.

In the region RI1 that does not overlap the gate electrode GE2, impurity regions RLs and RLd are formed. The impurity region RLs is formed between the channel forming region RC2 and an impurity region RHs, described later. The impurity region RLd is formed between the channel forming region RC2 and an impurity region RHd, described later. In the case in which it is unnecessary to distinguish between the impurity regions RLs and RLd, both are referred to as an impurity region RL. Since the impurity region RL does not overlap the gate electrode GE2 as well as the source electrode SE2 and the drain electrode DE2, the impurity element IM1 is injected, penetrating the insulating layer GI2 in the second injection process. The impurity concentration of the impurity element IM1 contained in the impurity region RL is referred to as an impurity concentration CT2. The impurity concentration CT2 is lower than the impurity concentration CT1.

In the region RI2s, the region that does not overlap the source electrode SE2 is referred to as the impurity region RHs. The impurity regions RHs is formed between impurity regions RLs and an impurity region RMs, described later. In the region RI2d, the region that does not overlap the drain electrode DE2 is referred to as the impurity region RHd. The impurity region RHd is formed between the impurity region RLd and an impurity region RMd, described later. In the case in which it is unnecessary to distinguish between the impurity region RHs and RHd specifically, both are referred to as an impurity region RH. Since the impurity region RH does not overlap the gate electrode GE2, the source electrode SE2, and the drain electrode DE2, the impurity element IM1 is injected, penetrating the insulating layer GI2 in the second injection process.

The impurity region RH contains the impurity element IM1 injected in the first injection process and the second injection process. The impurity concentration of the impurity element IM1 contained in the impurity region RH is referred to as an impurity concentration CT3. The impurity concentration CT3 is higher than the impurity concentrations CT1 and CT2.

In the region RI2s, the region in contact with the source electrode SE2 is referred to as a high-concentration impurity region HIs. The region that overlaps the source electrode SE2 and is different from the high-concentration impurity region HIs is referred to as the impurity region RMs.

In the region RI2s, the region in contact with the drain electrode DE2 is referred to as a high-concentration impurity region HId. The region that overlaps the drain electrode DE2 and is different from the high-concentration impurity region HId is referred to as the impurity region RMd.

In the case in which it is unnecessary to distinguish between the impurity region RMs and RMd specifically, both are referred to as an impurity region RM. In the case in which it is unnecessary to distinguish between the high-concentration impurity regions HIs and HId specifically, both are referred to as a high-concentration impurity region HI.

Since the impurity region RM overlaps the source electrode SE2 and the drain electrode DE2, the source electrode SE2, the drain electrode DE2, and the insulating layer GI2 serve as a mask in the second injection process, and no impurity element IM1 is injected.

The impurity region RM contains the impurity element IM1 injected in the first injection process. In the impurity region RM, the impurity concentration of the impurity element IM1 is the impurity concentration CT1.

The high-concentration impurity region HI is located in the semiconductor layer SC2 near the interface between the semiconductor layer SC2 and the insulating layer GI2. Since the insulating layer GI2 is removed from the contact hole CH, it can be said that the high-concentration impurity region HI is located near the interface between the semiconductor layer SC2 and the source electrode SE2 and the interface between the semiconductor layer SC2 and the drain electrode DE2. The entire high-concentration impurity region HI is in contact with the source electrode SE2 and the drain electrode DE2, and overlaps the source electrode SE2 and the drain electrode DE2.

In the contact hole CH that obtains electrical contact with the semiconductor layer SC2, the high-concentration impurity region HI is formed by injecting the impurity element IM1 into the semiconductor layer SC2 in the second injection process through the source electrode SE2 and the drain electrode DE2. The impurity concentration of the impurity element IM1 contained in the high-concentration impurity region HI is referred to as an impurity concentration CT4. The impurity concentration CT4 only has to be the same as the impurity concentration CT3. The impurity concentration CT4 is higher than the impurity concentrations CT1 and CT2.

The maximum concentration of the impurity element IM1 injected in the second injection process is located in the high-concentration impurity region HI in the third direction Z (thickness direction). In order that the impurity element IM1 has such a concentration distribution, the applied voltage at the time of injection only has to be adjusted.

As described above, the high-concentration impurity region HI is a region in which the semiconductor layer SC2 is in contact with the source electrode SE2 and the drain electrode DE2. As described above, the contact resistance might be high only by the contact between the source electrode SE2 and the drain electrode DE2, which are metal wiring lines, and the semiconductor layer SC2, which is an oxide semiconductor layer.

However, in the present embodiment, the impurity element IM1 is injected through the source electrode SE2 and the drain electrode DE2, this enables a reduction in the resistance of the semiconductor layer SC2, specifically the high-concentration impurity region HI.

The above-described injection process also serves as a termination treatment for the insulating layer GI2 formed of silicon oxide. The reliability of the semiconductor layer SC2 may be degraded due to the defect level existing in the insulating layer GI2. The defect level is primarily resulted from excess oxygen in silicon oxide. The defect functions as an electronic trap while the transistor Tr2 is being driven. As a result, this degrades the reliability of the transistor Tr2.

Hydrogen termination can also be used to repair defects in the insulating layer GI2. However, in the transistor Tr2, which is an oxide semiconductor transistor, a threshold value Vth might be greatly depleted due to excess hydrogen. An extreme Vth shift (deplete) might cause abnormal operation of the transistor Tr2 and the display device DSP including the transistor Tr2. Therefore, in the display device DSP, termination of the insulating layer GI2 with hydrogen is not preferable.

In the present embodiment, the insulating layer GI2 is terminated by the impurity element IM1, for example, boron, instead of hydrogen. The impurity element IM1 is not limited to this, and for example, phosphorus may be used.

FIGS. 5A to 5C are diagrams illustrating the transistor Tr2. FIG. 5B is a schematic plan view of the transistor Tr2. FIG. 5A is a cross-sectional view of the transistor Tr2 taken along line A1-A2 shown in FIG. 5B. FIG. 5C is a diagram showing the impurity concentration of the impurity element IM1 for each region in the semiconductor layer SC2 of the transistor Tr2.

By the manufacturing process shown in FIGS. 4A to 4C, the transistor Tr2 shown in FIG. 5A is formed. The semiconductor layer SC2 overlaps the gate electrode GE2, the source electrode SE2, and the drain electrode DE2.

In the transistor Tr2 shown in FIG. 5B, the end portion of the gate electrode GE2 protrudes from the end portion of the source electrode SE2 and the end portion of the drain electrode DE2 along the second direction Y. However, the shape of the gate electrode GE2 is not limited to this. The end portion of the gate electrode GE2, the end portion of the source electrode SE2, and the end portion of the drain electrode DE2 may be aligned, or the end portion of the source electrode SE2 and the end portion of the drain electrode DE2 may protrude from the end portion of the gate electrodes GE2 along the second direction Y.

The light-shielding layer LS2 overlaps the gate electrode GE2. In FIG. 5B, the length (width) of the light-shielding layer LS2 along the first direction X is longer than that of the gate electrode GE2.

As described above, the impurity concentration CT3 in the impurity region RH (RHs and RHd), the impurity concentration CT1 in the impurity region RM (the regions RMs and RMd), and the impurity concentration CT2 in the impurity region RL (RLs and RLd) are smaller in this order. That is, CT3>CT1>CT2. The impurity concentration CT4 in the high-concentration impurity region HI (HIs and HId) is the same as the impurity concentration CT3 in the impurity region RH. That is, CT3=CT4.

Assuming that the impurity concentration of the channel forming region RC2 is CT5, the impurity concentration CT5 is smaller than any of the impurity concentrations CT1 to CT4. Therefore, the relationship between the impurity concentrations CT1 to CT5 holds CT3 (=CT4)>CT1>CT2>CT5 (see FIG. 5C).

The higher the impurity concentration CT (CT1, CT2, CT3, CT4, and CT5), the lower the resistance value in the region in which the impurity element IM1 is injected.

The impurity region RMs, the impurity region RHs, and the high-concentration impurity region HIs can be collectively regarded as the source region RS2 of the transistor Tr2. The impurity region RMd, the impurity region RHd, and the high-concentration impurity region HId can be collectively regarded as the drain region RD2 of the transistor Tr2. Alternatively, in the present embodiment, the impurity region RMs and the impurity region RHs are sometimes referred to as the source region RS2, and the impurity region RMd and the impurity region RHd are sometimes referred to as the drain region RD2.

The impurity regions RLs and RLd function as low-concentration impurity regions, so-called Lightly Doped Drain (also referred to as LDD).

Figure 6:
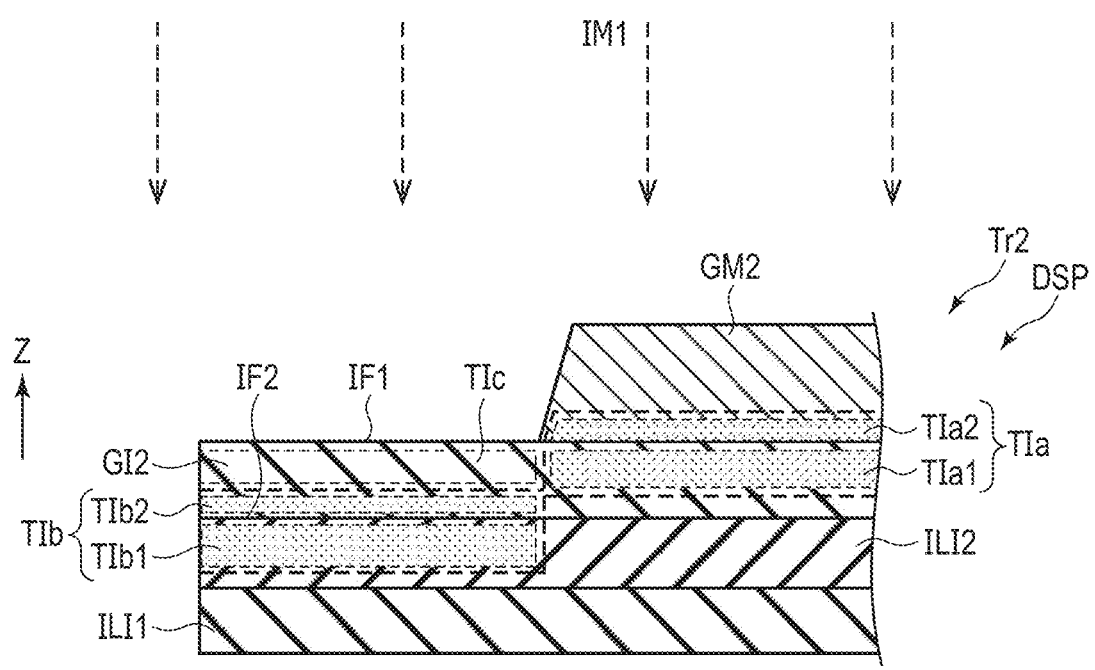
FIG. 6 is a partial cross-sectional view of a semiconductor device of an embodiment.

FIG. 6 is a partial cross-sectional view of the semiconductor device of the embodiment. In FIG. 6, the gate electrode GE2, the source electrode SE2, and the drain electrode DE2 are generally referred to as a metal layer GM2. FIG. 6 is a cross-sectional view of a region in which the semiconductor layer SC2 is not provided.

In the second injection process, the impurity element IM1 is injected through the metal layer GM2 in the region in which the metal layer GM2 is provided. In a part of the metal layer GM2, a region TIa2 containing the impurity element IM1 is formed, and in a part overlapping the metal layer GM2 in the insulating layer GI2, a region TIa1 containing the impurity element IM1 is formed.

The interface between the metal layer GM2 and the insulating layer GI2 is referred to as IF1, and the interface between the insulating layers GI2 and ILI2 is referred to as IF2. The region TIa2 is located near the interface IF1 in the metal layer GM2. The region TIa1 is located near the interface IF1 in the insulating layer GI2.

In the region in which no metal layer GM2 is provided, the region TIb1 containing the impurity element IM1 is formed in a part of the insulating layer ILI2, and the region TIb2 containing the impurity element IM1 is formed in a part of the insulating layer GI2. The region TIb1 is located near the interface IF2 in the insulating layer ILI2. The region TIb2 is located near the interface IF2 in the insulating layer GI2.

Although not shown in FIG. 6, in the case in which the semiconductor layer SC2 is provided between the insulating layers ILI2 and GI2 (see FIGS. 2 and 5A), the region TIb1 is formed in the semiconductor layer SC2. In that case, the description of the regions TIb1 and TIb2 may read the insulating layer ILI2 as the semiconductor layer SC2.

However, as described in FIG. 4A, the impurity element IM1 is already injected in the region RI2 in the first injection process. On the other hand, in the region RI1, no impurity element IM1 is injected in the first injection process. Therefore, the impurity concentration of the impurity element IM1 is different between the portion of the region RI1 corresponding to the region TIb1 and the portion of the region RI2 corresponding to the region TIb1.

The regions TIa1 and TIa2 are collectively referred to as a region TIa. The regions TIb1 and TIb2 are collectively referred to as a region TIb. The regions TIa and TIb each contain the impurity element IM1. The impurity element IM1 is, for example, boron. However, similarly to the above, the impurity element IM1 may be phosphorus.

In order to inject the impurity element IM1 into the insulating layer GI2 through the metal layer GM2, it is necessary to apply an applied voltage that exceeds the thickness of the metal layer GM2. When the impurity element IM1 is injected at such an applied voltage, in the insulating layers ILI2 and GI2 in the region in which no metal layer GM2 is provided, the maximum concentration of the impurity element IM1 is located at a portion away from the interface between the metal layer GM2 and the insulating layer GI2 in the direction opposite to the third direction Z (also referred to as a depth direction).

In other words, the region TIa contains the interface IF1 and the region TIb contains the interface IF2. The region TIa is located above the region TIb to the third direction Z.

Assuming that the region of the insulating layer GI2 above the region TIb and not overlapping the metal layer GM2 is TIc, the impurity concentration of the region TIc is lower than that of the region TIb. In addition, the impurity concentration in the region TIc is lower than that of the region TIa.

As described above, the semiconductor layer SC2, the insulating layer GI2, the gate electrode GE2, and the insulating layer ILI2 of the transistor Tr2 contain the impurity element IM1.

According to the present embodiment, it is possible to improve the reliability of the transistor Tr2, and it is possible to intend to improve the display performance of the display device DSP.

Configuration Example 1

FIG. 7 is a cross-sectional view showing another configuration example of the semiconductor device according to the embodiment. The configuration example illustrated in FIG. 7 is different from the configuration example illustrated in FIG. 4 in that the injection process is performed through a metal thin film.

FIGS. 7A to 7D are cross-sectional views showing a manufacturing process of a transistor Tr2 of the present configuration example. Similarly to FIG. 4A, a light-shielding layer LS2, an insulating layer ILI1, an insulating layer ILI2, a semiconductor layer SC2, and an insulating layer GI2 are formed on a base material BA1.

In the insulating layer GI2, a contact hole CH that reaches the semiconductor layer SC2 is formed.

With the insulating layer GI2 and the contact hole CH covered, a metal film ML1 is formed. The metal film ML1 is in contact with the semiconductor layer SC2 in the contact hole CH.

The metal film ML1 is a thin film formed of a metal material, and has, for example, a film thickness of 5 nm or more and 100 nm or less, preferably 10 nm. Examples of the material of the metal film ML1 include titanium (Ti) and titanium nitride (TiN).

Figure 7A:
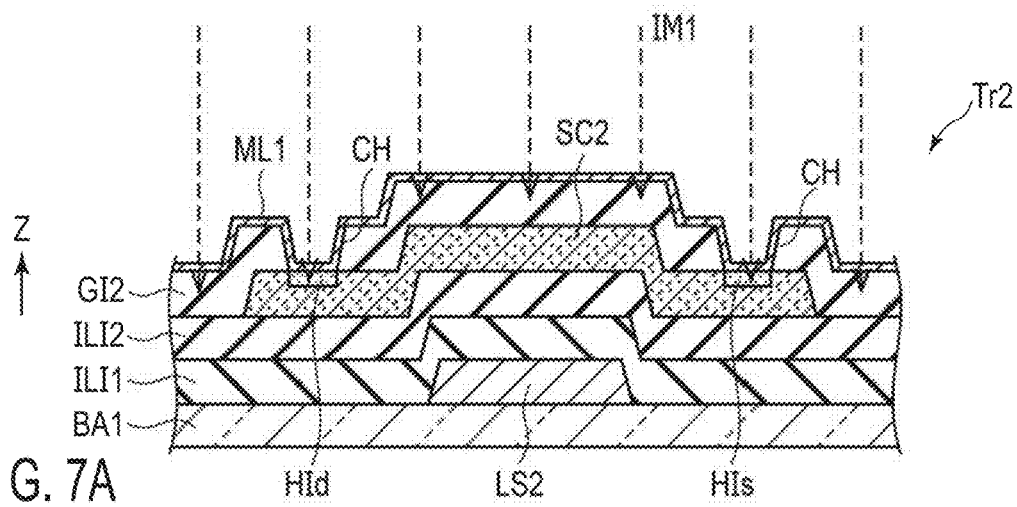
FIG. 7A is a cross-sectional view showing a configuration example of a semiconductor device according to an embodiment.

After forming the metal film ML1, an impurity element IM1 is injected into the semiconductor layer SC2, penetrating the metal film ML1 (see FIG. 7A). The injection process is referred to as a first injection process of the present configuration example.

In the semiconductor layer SC2, in the region that is in contact with the metal film ML1 at the contact hole CH, the impurity element IM1 is injected penetrating the thin film metal film ML1 that is a thin film. In the first injection process, a high-concentration impurity region HI (HIs and HId) is formed. In the first injection process, the resistance of the high-concentration impurity region HI is decreased. Similarly to the above, the high-concentration impurity region HI is located in the semiconductor layer SC2 near the interface between the semiconductor layer SC2 and the insulating layer GI2.

The maximum concentration of the impurity element IM1 injected in the first injection process is located in the high-concentration impurity region HI in the third direction Z (thickness direction). In order that the impurity element IM1 has such a concentration distribution, the applied voltage at the time of injection only has to be adjusted. In the region of the semiconductor layer SC2 other than the high-concentration impurity region HI, the insulating layer GI2 serves as a mask and the impurity element IM1 is not reached.

Figure 7B:
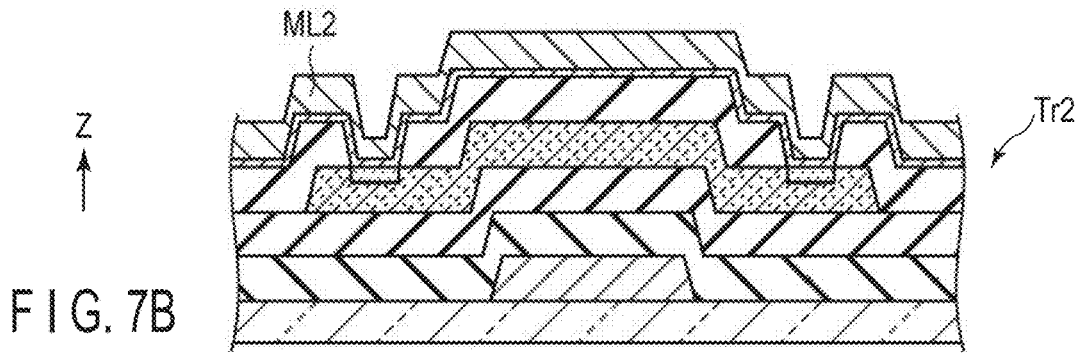
FIG. 7B is a cross-sectional view showing a configuration example of a semiconductor device according to an embodiment.

After the first injection process, metal film ML2 is formed covering the metal film ML1 (see FIG. 7B). The film thickness of the metal film ML2 is thicker than that of the metal film ML1. As the metal film ML2, for example, a titanium film or a stacked film of titanium and an aluminum film is formed in a film thickness of 100 nm or more and 500 nm or less, preferably 300 nm.

Figure 7C:
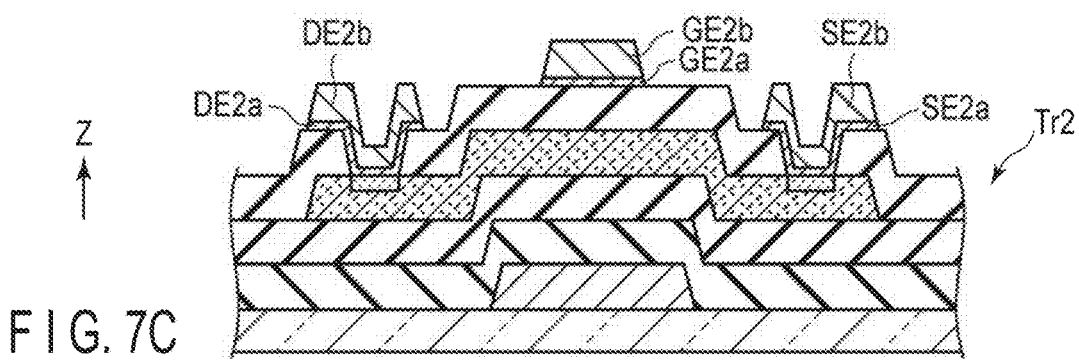
FIG. 7C is a cross-sectional view showing a configuration example of a semiconductor device according to an embodiment.

The metal films ML1 and ML2 are molded to form a gate electrode GE2, a source electrode SE2, and a drain electrode DE2 (see FIG. 7C). The gate electrode GE2 has a metal layer GE2$a$ formed from the metal film ML1 and a metal layer GE2$b$ formed from the metal film ML2. The source electrode SE2 has a metal layer SE2$a$ formed from the metal film ML1 and a metal layer SE2$b$ formed from the metal film ML2. The drain electrode DE2 has a metal layer DE2$a$ formed from the metal film ML1 and a metal layer DE2$b$ formed from the metal film ML2.

Figure 7D:
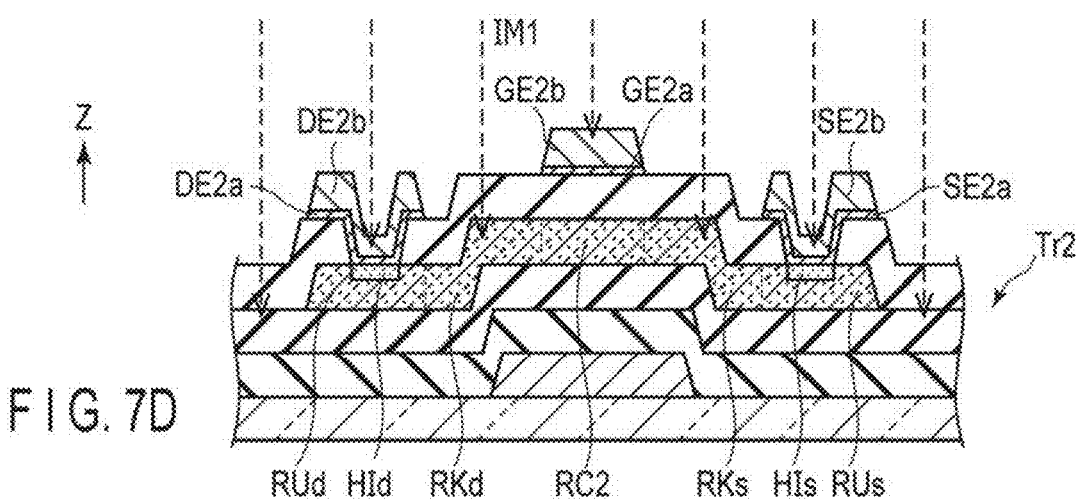
FIG. 7D is a cross-sectional view showing a configuration example of a semiconductor device according to an embodiment.

After forming the gate electrode GE2, the source electrode SE2, and the drain electrode DE2, the impurity element IM1 is injected into the semiconductor layer SC2 (see FIG. 7D). The injection process is referred to as a second injection process of the present configuration example.

In the second injection process, the impurity element IM1 does not reach the depth of the semiconductor layer SC2 in the regions of the semiconductor layer SC2 overlapping the gate electrode GE2, the source electrode SE2, and the drain electrode DE2 with the insulating layer GI2 interposed, and no impurity element IM1 is injected into the semiconductor layer SC2. In the second injection process, the resistance of the region in which the impurity element IM1 is injected is decreased.

In the semiconductor layer SC2, the region that overlaps the gate electrode GE2 is a channel forming region RC2. In the semiconductor layer SC2, the region that overlaps the source electrode SE2 and is different from the high-concentration impurity region HIs is referred to as a region RUs.

In the semiconductor layer SC2, the region that overlaps the drain electrode DE2 and is different from the high-concentration impurity region HId is referred to as a region RUd.

In the case in which it is unnecessary to distinguish between the regions RUs and RUd specifically, both are referred to as a region RU.

As described above, the high-concentration impurity region HI is located in the semiconductor layer SC2 near the interface between the semiconductor layer SC2 and the insulating layer GI2. Since the insulating layer GI2 is removed from the contact hole CH1, it can be said that the high-concentration impurity region HI is located near the interface between the semiconductor layer SC2 and the source electrode SE2 and the interface between the semiconductor layer SC2 and the drain electrode DE2. The entire high-concentration impurity region HI is in contact with the source electrode SE2 and the drain electrode DE2, and overlaps the source electrode SE2 and the drain electrode DE2. The concentration of the high-concentration impurity region HI is referred to as an impurity concentration CN1.

The region between the channel forming region RC2 and the region RUs and the region between the channel forming region RC2 and the region RUd are referred to as impurity regions RKs and RKd, respectively. In the case in which it is unnecessary to distinguish between the impurity region RKs and RKd specifically, the impurity region RKs and RKd are referred to as an impurity region RK. Assuming that the impurity concentration of the impurity element IM1 in the impurity region RK is CN2, the impurity concentration CN2 is larger than or equivalent to the impurity concentration CN1.

As described in the embodiment, in the region in which the semiconductor layer SC2 is in contact with the source electrode SE2 and the drain electrode DE2, the contact resistance might be high. However, also in the present configuration example, the impurity element IM1 is injected into the semiconductor layer SC2, penetrating the metal film ML1, the source electrode SE2, and the drain electrode DE2, and thus it is possible to decrease the resistance.

Figure 8A:
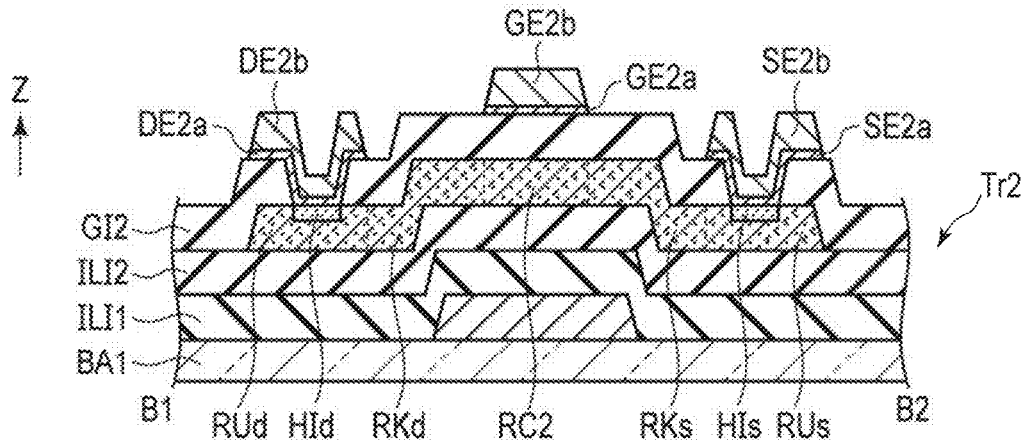
FIG. 8A is a diagram illustrating a transistor.
Figure 8B:
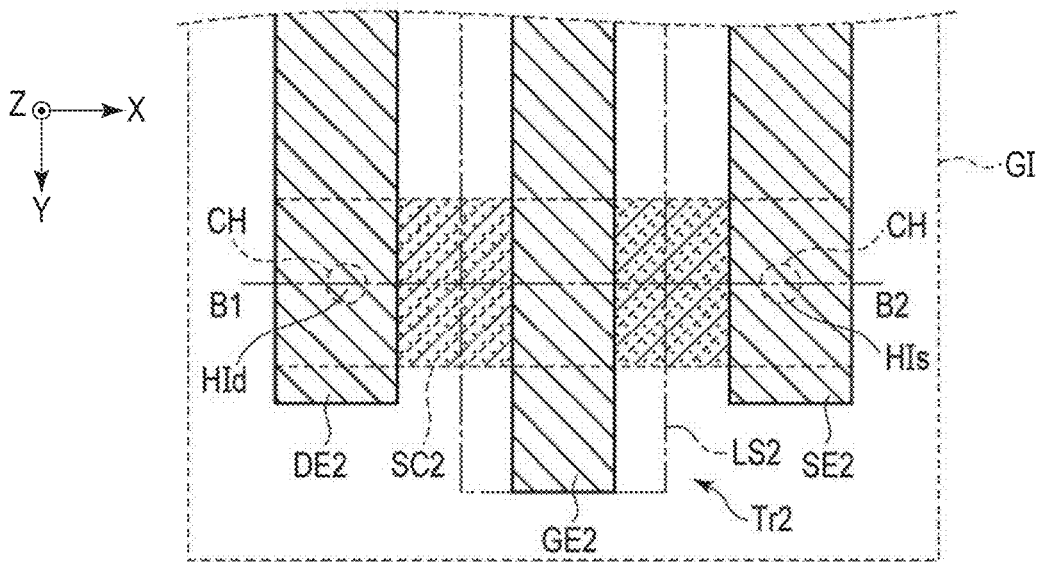
FIG. 8B is a diagram illustrating a transistor.
Figure 8C:
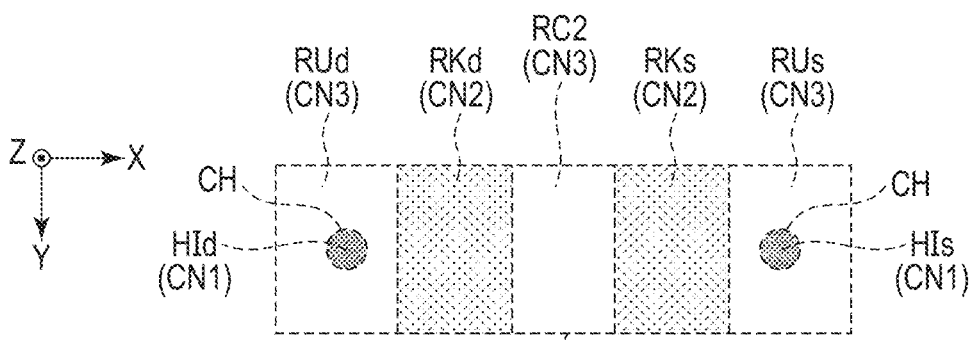
FIG. 8C is a diagram illustrating a transistor.

FIGS. 8A to 8C are diagrams illustrating the transistor Tr2. FIG. 8B is a schematic plan view of the transistor Tr2. FIG. 8A is a cross-sectional view of the transistor Tr2 taken along lines B1-B2 shown in FIG. 8B FIG. 8C is a diagram showing the impurity concentration of the impurity element IM1 for each region in the semiconductor layer SC2 of the transistor Tr2.

By the manufacturing process shown in FIGS. 7A to 7C, the transistor Tr2 shown in FIG. 8A is formed. The semiconductor layer SC2 overlaps the gate electrode GE2, the source electrode SE2, and the drain electrode DE2.

In the transistor Tr2 shown in FIG. 8B, the end portion of the gate electrode GE2 protrudes from the end portion of the source electrode SE2 and the end portion of the drain electrode DE2 along the second direction Y. However, the shape of the gate electrode GE2 is not limited to this. The end portion of the gate electrode GE2, the end portion of the source electrode SE2, and the end portion of the drain electrode DE2 may be aligned, or the end portion of the source electrode SE2 and the end portion of the drain electrode DE2 may protrude from the end portion of the gate electrodes GE2 along the second direction Y.

The light-shielding layer LS2 overlaps the gate electrode GE2. In FIG. 8B, the length (width) of the light-shielding layer LS2 along the first direction X is longer than that of the gate electrode GE2.

As described above, the impurity concentration CN1 in the high-concentration impurity region HI (HIs and HId) is smaller than or equivalent to the impurity concentration CN2 in the impurity region RK (RKs and RKd).

Assuming that the impurity concentrations of the channel forming region RC2 and the region RU (RUs and RUd) are CN3, the impurity concentration CN3 is smaller than the impurity concentrations CN1 and CN2.

Therefore, the relationship between the impurity concentrations CN1, CN2, and CN3 holds CN2≥CN1>CN3 (see FIG. 8C).

The higher the impurity concentration CN (CN1, CN2, and CN3), the lower the resistance value of the region into which the impurity element IM1 is injected.

Also in the present configuration example, the same effect as that of the embodiment is exerted.

Configuration Example 2

FIGS. 9A to 9D are cross-sectional views showing another configuration example of the semiconductor device according to the embodiment. The configuration example illustrated in FIG. 9 is different from the configuration example illustrated in FIG. 7 in that a part of the source electrode and a part of the drain electrode are removed.

Figure 9A:
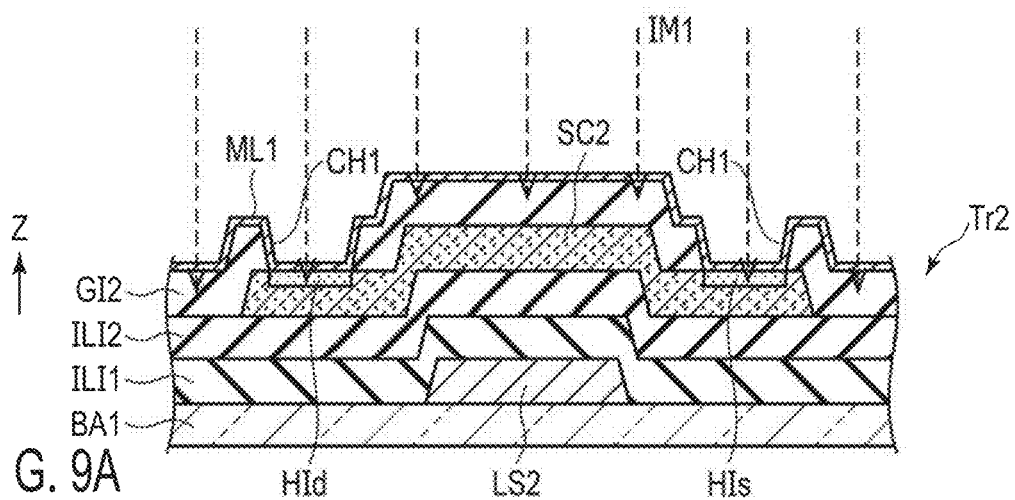
FIG. 9A is a cross-sectional view showing a configuration example of a semiconductor device according to an embodiment.
Figure 9B:
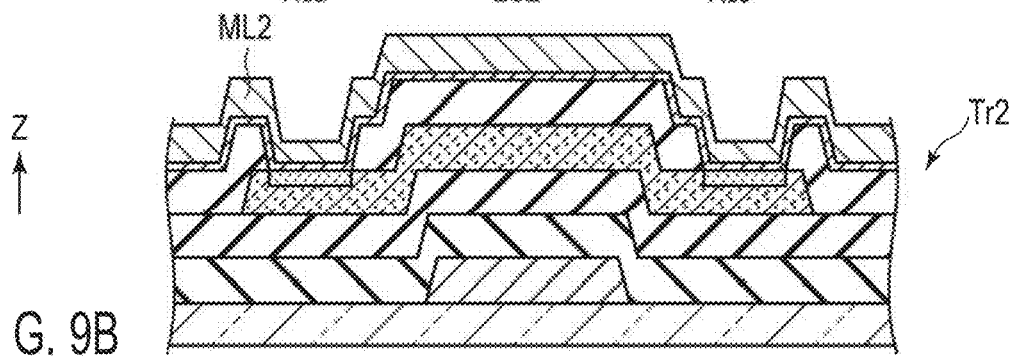
FIG. 9B is a cross-sectional view showing a configuration example of a semiconductor device according to an embodiment.

FIGS. 9A to 9D are cross-sectional views showing a manufacturing process of a transistor Tr2 of the present configuration example. The manufacturing process shown in FIGS. 9A to 9B is the same as the manufacturing process shown in FIGS. 7A and 7B. The description of FIGS. 9A and 9B incorporates and omits the description of FIGS. 7A and 7B. However, in the description of FIGS. 7A and 7B, the contact hole CH will be read as a contact hole CH1. The injection process shown in FIG. 9A is referred to as a first injection process of the present configuration example.

However, the width (length in the X-Y plane) of the contact hole CH1 shown in FIG. 9A is to be longer than the width of the contact hole CH shown in FIG. 7A.

Figure 9C:
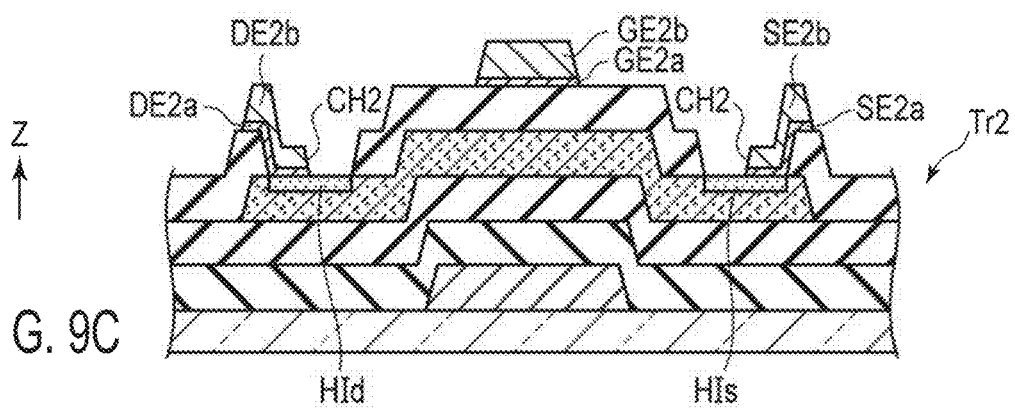
FIG. 9C is a cross-sectional view showing a configuration example of a semiconductor device according to an embodiment.

As shown in FIG. 9C, metal films ML1 and ML2 are molded to form a gate electrode GE2, a source electrode SE2, and a drain electrode DE2. The gate electrode GE2 has a metal layer GE2a formed from the metal film ML1 and a metal layer GE2b formed from the metal film ML2. The source electrode SE2 has a metal layer SE2a formed from the metal film ML1 and a metal layer SE2b formed from the metal film ML2. The drain electrode DE2 has a metal layer DE2a formed from the metal film ML1 and a metal layer DE2b formed from the metal film ML2.

When the metal films ML1 and ML2 are molded, the metal films ML1 and ML2 provided in the contact hole CH1 are partially removed to form a contact hole CH2. At the bottom of the contact hole CH2, a high-concentration impurity region HI of the semiconductor layer SC2 is partially exposed.

In the contact hole CH2, the source electrode SE2 and the drain electrode DE2 overlap a part of the high-concentration impurity region HI and do not overlap the other part. In other words, the high-concentration impurity region HI includes a region that overlaps the source electrode SE2 and the drain electrode DE2 and a region that does not overlap.

Figure 9D:
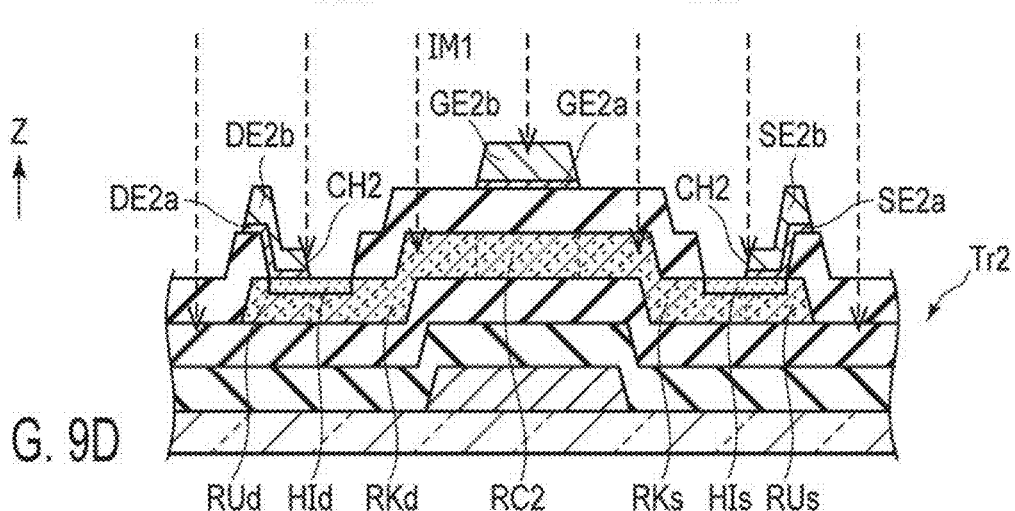
FIG. 9D is a cross-sectional view showing a configuration example of a semiconductor device according to an embodiment.

After forming the gate electrode GE2, the source electrode SE2, and the drain electrode DE2, an impurity element IM1 is injected into the semiconductor layer SC2 (see FIG. 9D). Similarly to configuration example 1, the injection process is referred to as a second injection process of the present configuration example.

In the second injection process, the impurity element IM1 does not reach the depth of the semiconductor layer SC2 in the regions overlapping the gate electrode GE2, the source electrode SE2, and the drain electrode DE2, and no impurity element IM1 is injected into the semiconductor layer SC2. In the second injection process, the resistance of the region in which the impurity element IM1 is injected is decreased.

In the semiconductor layer SC2, the region that overlaps the gate electrode GE2 is a channel forming region RC2. In the semiconductor layer SC2, the region that overlaps the source electrode SE2 and is different from a high-concentration impurity region HIs is referred to as a region RUs.

In the semiconductor layer SC2, the region that overlaps the drain electrode DE2 and is different from the high-concentration impurity region HId is referred to as a region RUd.

In the case in which it is unnecessary to distinguish between the regions RUs and RUd specifically, both are referred to as a region RU.

The region between the channel forming region RC2 and the region RUs and the region between the channel forming region RC2 and the region RUd are referred to as impurity regions RKs and RKd, respectively. In the case in which it is unnecessary to distinguish between the impurity region RKs and RKd specifically, the impurity region RKs and RKd are referred to as an impurity region RK. Assuming that the impurity concentration of the impurity element IM1 in the impurity region RK is CN2, the impurity concentration CN2 is larger than or equivalent to the impurity concentration CN1.

In the manufacturing process shown in FIG. 9C, a part of the high-concentration impurity region HI is exposed at the bottom of the contact hole CH2.

In FIG. 9D, as compared with FIG. 7D, the region below a part of the exposed high-concentration impurity region HI in the semiconductor layer SC2 is included in the impurity region RK. In the present configuration example, as compared with configuration example 1, it is possible to widen the width of the impurity region RK. In FIG. 7D, the impurity region RK and the high-concentration impurity region HI are connected through the region RU, whereas in FIG. 9D, the impurity region RK and the high-concentration impurity region HI can be directly connected.

Figure 10A:
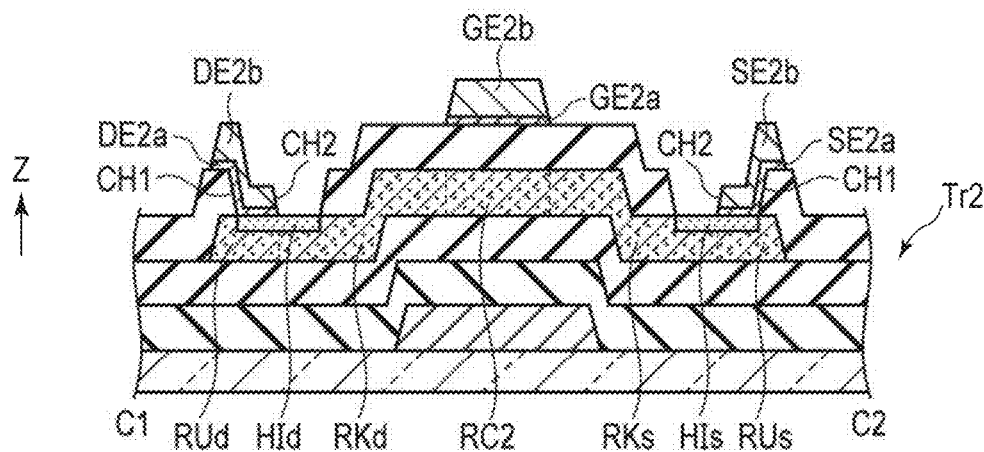
FIG. 10A is a diagram illustrating a transistor.
Figure 10B:
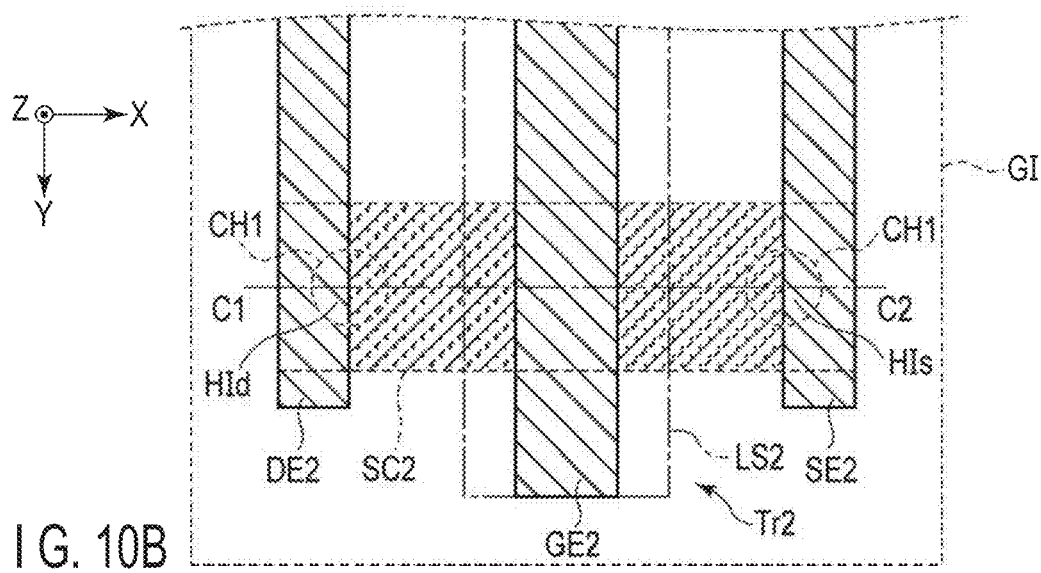
FIG. 10B is a diagram illustrating a transistor.
Figure 10C:
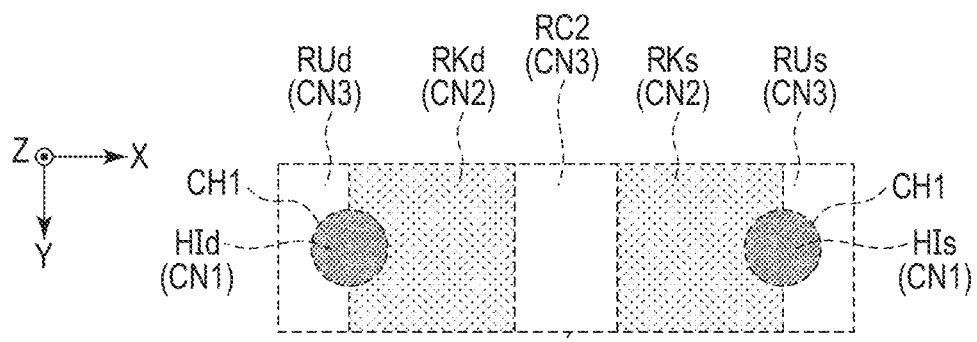
FIG. 10C is a diagram illustrating a transistor.

FIGS. 10A to 10C are diagrams illustrating the transistor Tr2. FIG. 10B is a schematic plan view of the transistor Tr2. FIG. 10A is a cross-sectional view of the transistor Tr2 taken along line C1-C2 shown in FIG. 10B. FIG. 10C is a diagram showing the impurity concentration of the impurity element IM1 for each region in the semiconductor layer SC2 of the transistor Tr2.

By the manufacturing process shown in FIGS. 9A to 9C, the transistor Tr2 shown in FIG. 10A is formed. The semiconductor layer SC2 overlaps the gate electrode GE2, the source electrode SE2, and the drain electrode DE2.

In the transistor Tr2 shown in FIG. 10B, the end portion of the gate electrode GE2 protrudes from the end portion of the source electrode SE2 and the end portion of the drain electrode DE2 along the second direction Y. However, the shape of the gate electrode GE2 is not limited to this. The end portion of the gate electrode GE2, the end portion of the source electrode SE2, and the end portion of the drain electrode DE2 may be aligned, or the end portion of the source electrode SE2 and the end portion of the drain electrode DE2 may protrude from the end portion of the gate electrodes GE2 along the second direction Y.

The light-shielding layer LS2 overlaps the gate electrode GE2. In FIG. 10B, the length (width) of the light-shielding layer LS2 along the first direction X is longer than that of the gate electrode GE2.

As described above, the impurity concentration CN1 in the high-concentration impurity region HI (HIs and HId) is smaller than or equivalent to the impurity concentration CN2 in the impurity region RK (RKs and RKd).

Assuming that the impurity concentrations of the channel forming region RC2 and the region RU (RUs and RUd) are CN3, the impurity concentration CN3 is smaller than the impurity concentrations CN1 and CN2.

Therefore, the relationship between the impurity concentrations CN1, CN2, and CN3 holds CN2≥CN1>CN3 (see FIG. 10C).

The higher the impurity concentration CN (CN1, CN2, and CN3), the lower the resistance value of the region into which the impurity element IM1 is injected.

Also in the present configuration example, the same effect as that of the embodiment is exerted.

Configuration Example 3

Figure 11:
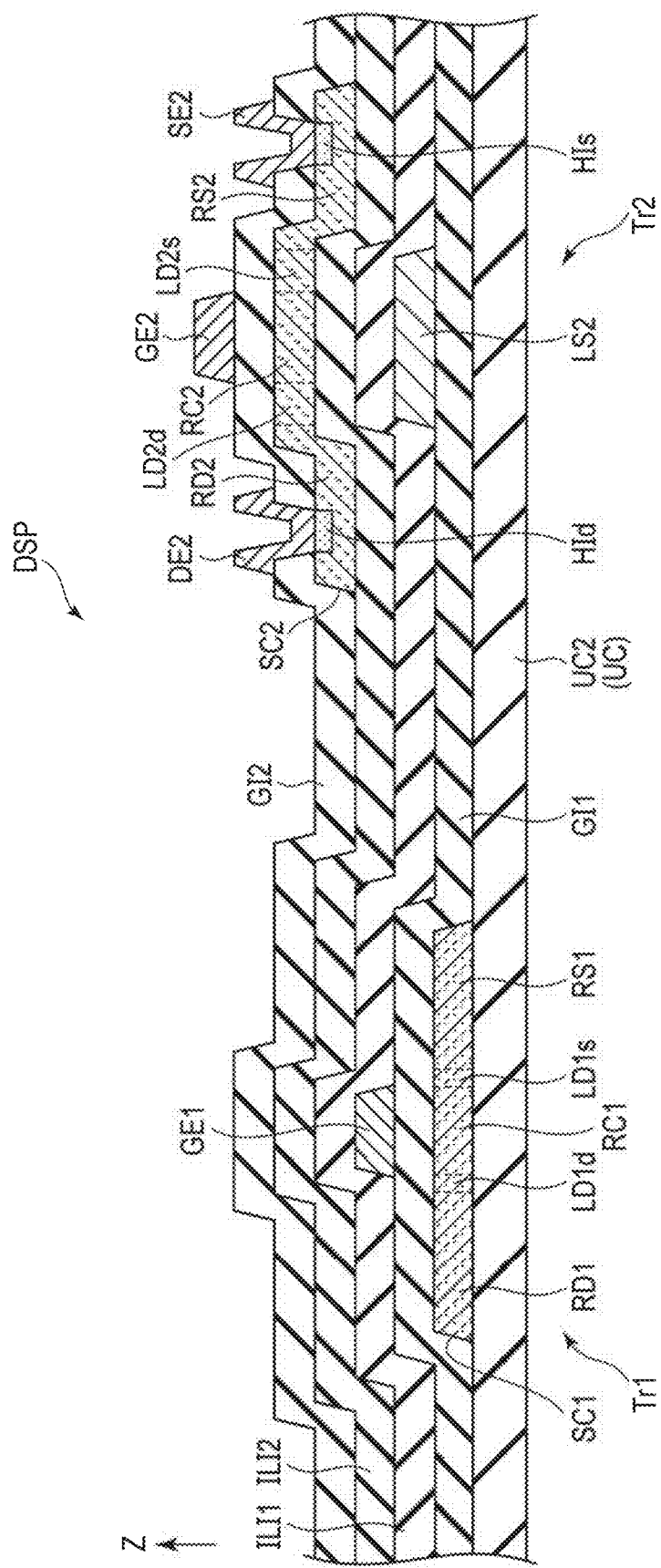
FIG. 11 is a plan view illustrating another configuration example of a display device according to an embodiment.

FIG. 11 is a cross-sectional view showing another configuration example of the display device according to the embodiment. The configuration example illustrated in FIG. 11 is different from the configuration example illustrated in FIG. 2 in that the width of the light-shielding layer is shorter than the width of the semiconductor layer.

FIG. 11 is a partially enlarged view of a display device DSP. In FIG. 11, transistors Tr1 and Tr2 are shown alone. For the description of the components other than the transistors Tr1 and Tr2, the description of FIG. 2 is incorporated and the description of the components is omitted.

The stacked structure of the transistor Tr2 is the same as the structure shown in FIG. 5A. Details will be described later.

The transistor Tr1 has a channel forming region RC1, a low-concentration impurity regions LD1s and LD1d, a source region RS1, and a drain region RD1 in the semiconductor layer SC1. The low-concentration impurity region LD1s is located between the channel forming region RC1 and the source region RS1. The low-concentration impurity region LD1d is located between the channel forming region RC1 and the drain region RD1.

The impurity concentration of the impurity element contained in the low-concentration impurity region LD1 (LD1s and LD1d) is smaller than the impurity concentration of the impurity element contained in the source region RS1 and the drain region RD1.

The impurity element contained in the source region RS1, the drain region RD1, and the low-concentration impurity region LD1 is an impurity element that imparts polarity to the transistor Tr1, which is, for example, phosphorus or boron. The impurity element may be the same as or different from the impurity element IM1 contained in the semiconductor layer SC2 of the transistor Tr2.

The transistor Tr2 has a channel forming region RC2, a high-concentration impurity regions HIs and HId, a low-concentration impurity regions LD2s and LD2d, a source region RS2, and a drain region RD2 in the semiconductor layer SC2. The low-concentration impurity region LD2s is located between the channel forming region RC2 and the source region RS2. The low-concentration impurity region LD2d is located between the channel forming region RC2 and the drain region RD2.

In a light-shielding layer LS2 of the transistor Tr2, the length (width) in the plane (X-Y plane) perpendicular to the third direction Z is shorter than the length of the semiconductor layer SC2. The light-shielding layer LS2 only has to overlap the channel forming region RC2.

The high-concentration impurity region HI (HIs and HId) in FIG. 11 is similar to the high-concentration impurity region HI (HIs and HId) shown in FIG. 5A.

The source region RS2 contains the impurity regions RMs and RHs shown in FIG. 5A. The drain region RD2 contains the impurity regions RMd and RHd shown in FIG. 5A.

The low-concentration impurity regions LD2s and LD2d correspond to the impurity regions RLs and RLd shown in FIG. 5A.

Also in the present configuration example, the same effect as that of the embodiment is exerted.

In the present disclosure, the impurity regions RM, RL, and RH shown in FIGS. 4A to 4C and 5A to 5C are also referred to as a first impurity region, a second impurity region, and a third impurity region, respectively. The impurity concentrations CT1, CT2, and CT3 of the impurity element IM1 contained in the impurity regions RM, RL, and RH are also referred to as a first concentration, a second concentration, and a third concentration, respectively. The impurity concentration CT4 of the impurity element IM1 contained in the high-concentration impurity region HI and the impurity concentration CT5 of the impurity element IM1 contained in the channel forming region RC2 are also referred to as a fourth concentration and a fifth concentration, respectively.

In the present disclosure, as shown in FIGS. 7A to 7C and 8A, the entire high-concentration impurity region HI is in contact with and overlaps the entire source electrode SE2 and drain electrode DE2. As shown in FIGS. 9A to 9C and 10A, a part of the high-concentration impurity region HI is in contact with and overlaps the source electrode SE2 and the drain electrode DE2. In other words, at least a part of the high-concentration impurity region HI is in contact with ad overlaps the source electrode SE2 and the drain electrode DE2.

In the present disclosure, the region RU and the impurity region RK shown in FIGS. 7A to 7C, 8A to 8C, 9A to 9C, and 10A to 10C are also referred to as a first region and a second impurity region, respectively. The impurity concentration CN1 of the impurity element IM1 contained in the high-concentration impurity region HI, the impurity concentration CN2 of the impurity element IM1 contained in the impurity region RK, and the impurity concentration CN3 of the impurity element IM1 contained in the region RU and the channel forming region RC2 are also referred to as a first concentration, a second concentration, and a third concentration, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
an oxide semiconductor layer;
an insulating layer in contact with the oxide semiconductor layer; and
a gate electrode, a source electrode, and a drain electrode, the gate electrode, the source electrode, and the drain electrode overlapping the oxide semiconductor layer, wherein
the oxide semiconductor layer includes
a channel forming region overlapping the gate electrode,
a high-concentration impurity region in contact with the source electrode and the drain electrode,
a first impurity region overlapping the source electrode and the drain electrode, the first impurity region being different from the high-concentration impurity region,
a second impurity region provided between the channel forming region and the first impurity region, and
a third impurity region provided between the first impurity region and the second impurity region,
the high-concentration impurity region, the first impurity region, the second impurity region, and the third impurity region contain the same impurity element,
in a first concentration of the impurity element contained in the first impurity region, a second concentration of the impurity element contained in the second impurity region, a third concentration of the impurity element contained in the third impurity region, and a fourth concentration of the impurity element contained in the high-concentration impurity region, the third concentration is equal to the fourth concentration, the third concentration is higher than the first concentration, and the first concentration is higher than the second concentration, and
the source electrode and the drain electrode contain the impurity element.

2. The semiconductor device according to claim 1, wherein the gate electrode contains the impurity element.

3. The semiconductor device according to claim 1, wherein the insulating layer is made of silicon oxide.

4. A display device comprising:
a display area including a plurality of pixels;
a non-display area provided around the display area;
the semiconductor device according to claim 1, the semiconductor device being provided in the pixel;
a transistor provided in the non-display region, the transistor having a polycrystalline silicon layer as an active layer; and
a display function layer.

5. A semiconductor device comprising:
an oxide semiconductor layer;
an insulating layer in contact with the oxide semiconductor layer; and
a gate electrode, a source electrode, and a drain electrode, the gate electrode, the source electrode, and the drain electrode overlapping the oxide semiconductor layer, wherein
the oxide semiconductor layer includes
a channel forming region overlapping the gate electrode,
a high-concentration impurity region, at least a part of the high-concentration impurity region being in contact with and overlapping the source electrode and the drain electrode,
a first region overlapping the source electrode and the drain electrode, the first region being different from the high-concentration impurity region, and
a second impurity region provided between the channel forming region and the first region,
the source electrode and the drain electrode have a stacked structure of a first metal layer and a second metal layer,
the high-concentration impurity region and the second impurity region contain the same impurity element,
a first concentration of the impurity element contained in the high-concentration impurity region is lower than or equivalent to a second concentration of the impurity element contained in the second impurity region, and
the source electrode and the drain electrode contain the impurity element.

6. The semiconductor device according to claim 5, wherein the high-concentration impurity region in entirety is in contact with and overlaps the source electrode and the drain electrode.

7. The semiconductor device according to claim 5, wherein the part of the high-concentration impurity region is in contact with and overlaps the source electrode and the drain electrode, and another part of the high-concentration impurity region does not overlap the source electrode and the drain electrode.

8. The semiconductor device according to claim 5, wherein a film thickness of the second metal layer is thicker than a film thickness of the first metal layer.

9. The semiconductor device according to claim 5, wherein the gate electrode contains the impurity element.

10. The semiconductor device according to claim 5, wherein the insulating layer is made of silicon oxide.

11. A display device comprising:
- a display area including a plurality of pixels;
- a non-display area provided around the display area;
- the semiconductor device according to claim 6 provided in the pixel;
- a transistor provided in the non-display region, the transistor having a polycrystalline silicon layer as an active layer; and
- a display function layer.

* * * * *